(12) United States Patent
Shimada

(10) Patent No.: US 8,008,582 B2
(45) Date of Patent: Aug. 30, 2011

(54) ANISOTROPIC ELECTRICALLY CONDUCTIVE STRUCTURE

(75) Inventor: Masashi Shimada, Atsugi (JP)

(73) Assignee: 3M Innovative Properties Company, St. Paul, MN (US)

( * ) Notice: Subject to any disclaimer, the term of this patent is extended or adjusted under 35 U.S.C. 154(b) by 1005 days.

(21) Appl. No.: 11/908,517

(22) PCT Filed: Mar. 21, 2006

(86) PCT No.: PCT/US2006/010239
§ 371 (c)(1),
(2), (4) Date: Sep. 13, 2007

(87) PCT Pub. No.: WO2006/104768
PCT Pub. Date: Oct. 5, 2006

(65) Prior Publication Data
US 2008/0156522 A1    Jul. 3, 2008

(30) Foreign Application Priority Data

Mar. 28, 2005   (JP) ................. 2005-091980

(51) Int. Cl.
*H05K 1/09* (2006.01)
*H05K 1/11* (2006.01)
(52) U.S. Cl. ............ 174/257; 174/259; 174/262

(58) Field of Classification Search .......... 174/262–266, 174/257, 259; 361/792–795
See application file for complete search history.

(56) References Cited

U.S. PATENT DOCUMENTS

| 5,438,223 A | 8/1995 | Higashi | |
|---|---|---|---|
| 5,819,406 A * | 10/1998 | Yoshizawa et al. | 29/877 |
| 6,350,791 B1 * | 2/2002 | Feichtmeier et al. | 522/81 |
| 2003/0155656 A1 | 8/2003 | Chiu et al. | |

FOREIGN PATENT DOCUMENTS

| EP | 0 560 072 A2 | 9/1993 |
|---|---|---|
| EP | 0 898 794 B1 | 3/2000 |
| JP | 05-258790 A | 10/1993 |
| JP | 9-330774 A | 12/1997 |
| JP | 2000-243147 A | 9/2000 |
| JP | 2002 146319 A | 5/2002 |
| WO | WO 04/000966 A | 12/2003 |

* cited by examiner

*Primary Examiner* — Jeremy C Norris
(74) *Attorney, Agent, or Firm* — Bradford B. Wright

(57) ABSTRACT

An anisotropic electrically conductive structure comprising: a dielectric matrix having a first surface and a second surface; a heat curable adhesive layer disposed on at least one or both of said first surface and said second surface; a plurality of passages at least extending from said first surface of said matrix to said second surface of said matrix; and electrically conductive members in said passages; wherein said dielectric matrix does not exhibit thermal fluidization at a temperature required for heat curing of said heat curable adhesive layer.

6 Claims, 2 Drawing Sheets

ANISOTROPIC ELECTRICALLY CONDUCTIVE STRUCTURE

CROSS REFERENCE TO RELATED APPLICATIONS

This application is a national stage filing under 35 U.S.C. 371 of PCT/US2006/010239, filed Mar. 21, 2006, which claims priority to Japanese Application No. 2005-091980, filed Mar. 28, 2005, the disclosure of which is incorporated by reference in its/their entirety herein.

FIELD

The present invention relates to an anisotropic electrically conductive structure.

BACKGROUND

Fine electronic components, such as integrated circuit chips or devices, terminal pads of printed circuit boards, liquid crystal displays, etc., have electrical connecting parts for connection to external circuits. In the case of connection of chips to external circuits, in particular, these electrical connecting parts are present at very high density, and separation of each of these electrical connecting parts from adjoining parts is typically 0.1 mm or less. These electrical connecting parts existing at high density have to be electrically insulated from adjoining parts in order to avoid occurrence of short circuit between them. Therefore, an anisotropic electrically conductive structure which is electrically conductive only in one direction, and is electrically insulating in other directions, has been generally used for these connecting parts.

Various documents are known on an anisotropic electrically conductive structure. For example, Patent Document 1 (Japanese Unexamined Patent Publication (Kokai) No. 9-330774) discloses a stacking connecting connector interposed between two stacked objects to be connected which connects these objects to each other when the two objects to be connected are pressed in prescribed direction so as to approach to each other, comprising contacts for connecting the two objects to be connected, and an insulator for holding these contacts. The connector is pressed and fixed to the two objects to be connected using mechanical means such as bolts and nuts so as to complete the connection. Such mechanical means, however, are bulky, and therefore may become an impediment to downsizing and miniaturization of electronic parts.

On the other hand, Patent Document 2 (Japanese Unexamined Patent Publication (Kokai) No. 62-117207) discloses an isotropic electrically conductive polymer material in which a multiplicity of electrically conductive members penetrate through a polymer layer and are arranged with uniform separation so as to be electrically insulated from each other, wherein each of said members has an electrical conductive material extending across the thickness of the polymer layer so as to conduct electric current across the polymer layer through said members.

Also, Patent Document 3 (National Publication (Kohyo) No. 2000-511339) discloses an anisotropic electrically conductive structure comprising a dielectric matrix material having a first surface and a second surface, at least one passage extending from said first surface of said material to said second surface of said material, and an electrically conductive member in said passage, wherein said electrically conductive member includes at least one electrically conductive element having maximum dimensions of at least 5% of the length of said passage and at least 10% of the width of said passage.

In Patent Documents 2 and 3, it is disclosed that thermoplastic resins, thermoplastic elastomers, and heat curable materials can be used as the polymer material or the dielectric material, and that, when adhesion to connecting parts is required, hot pressure sensitive adhesive hot-melt can also be used. However, since these materials soften at the time of connection and may be fluidized so that it is not always easy to maintain insulation between conductive passages.

SUMMARY

Therefore, it is an object of at least on aspect of the present invention to provide an anisotropic electrically conductive structure that is capable of easily connecting objects to be connected without using mechanical means.

In accordance with one aspect of the present invention, there is provided an anisotropic electrically conductive structure comprising a dielectric matrix having a first surface and a second surface; a heat curable adhesive layer disposed on at least one or both of said first surface and said second surface; a plurality of passages at least extending from said first surface of said matrix to said second surface of said matrix; and electrically conductive members in said passages; wherein said dielectric matrix does not exhibit thermal fluidization at a temperature required for heat curing of said heat curable adhesive layer.

Since the anisotropic electrically conductive structure of the present invention has an adhesive layer provided on the surface, it can connect, by hot press bonding, the objects to be connected having connecting parts at high density, without using mechanical means such as rivets or combinations of bolt/nut.

Since the anisotropic electrically conductive structure of the present invention has a heat curable adhesive layer separately from the dielectric matrix, fluidization of the matrix at the time of heating for heat curing of the adhesive layer, which may lead to occurrence of short circuit, can be avoided, and connection can be carried out easily.

DISCLOSURE

The present invention will now be described below with reference to embodiments. It is to be understood that the present invention is by no means limited to these embodiments.

The anisotropic electrically conductive structure comprises a dielectric matrix having a first surface and a second surface; a heat curable adhesive layer disposed on at least one or both of said first surface and said second surface; a plurality of passages at least extending from said first surface to said second surface of said matrix; and electrically conductive members in said passages; wherein said dielectric matrix does not exhibit thermal fluidization at a temperature required for heat curing of said heat curable adhesive layer.

Figure 1:
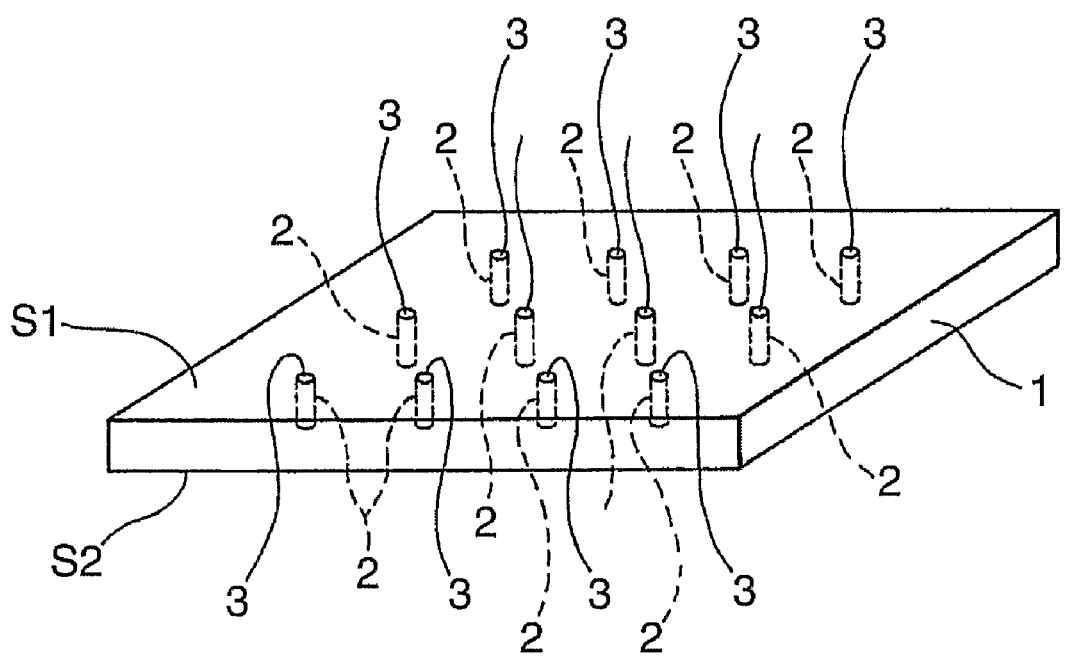
FIG. 1 is a perspective view showing a structure according to an embodiment having electrically conductive members in a plurality of passages extending from a first surface to a second surface of a dielectric matrix.
Figure 2:
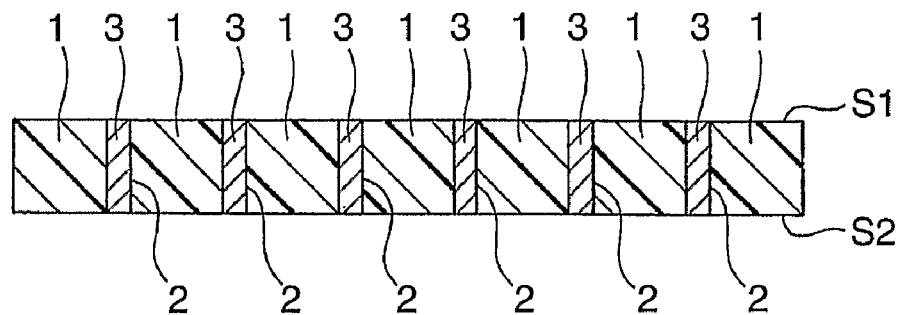
FIG. 2 is a sectional view showing the structure of FIG. 1.

FIGS. 1 and 2 are a perspective view and a sectional view, respectively, showing an embodiment of the structure comprising electrically conductive members in a plurality of passages extending from the first surface to the second surface of the dielectric matrix. As shown in the figures, electrically conductive members 3 are contained in a plurality of passages 2 extending from the first surface S1 to the second surface S2 in the dielectric matrix 1. While insulation between adjoining passages 2 is ensured by insulating property of the dielectric matrix 1, the electrically conductive members 3 in the passages 2 assure a plurality of electrically conductive paths extending from the first surface S1 to the second surface S2.

Materials which have electrically insulating property and do not exhibit thermal fluidization at temperature encountered in heat curing of the heat curable adhesive layer (for example, 120° C. or higher) can be used as the dielectric matrix. It is also desirable that the dielectric matrix has good thermal resistance and does not give rise to thermal decomposition at such temperature. Materials suitable for the dielectric matrix include, for example, a heat resistant elastomer such as silicone rubber, fluoro-silicone, or fluoro-elastomer, heat resistant resin such as polyimide resin, and hardened product of heat curable resins such as hardened product of epoxy resins.

The dielectric matrix has passages extending from the first surface to the second surface, and has electrically conductive members in the passages. The electrically conductive members can be made of copper, gold, silver, nickel, tungsten, tin, lead, palladium, bismuth, indium and alloys of these metals. The electrically conductive members may be thin wires or particles of electrically conductive material. In the case where the electrically conductive members are particles, these particles are generally bonded with a bonding agent to form the electrically conductive members. Useful bonding agents include, for example, heat curable resins such as epoxy resins and cyanate esters, polymer materials such as silicone rubber, fluoro-silicone, and fluoro-elastomer.

The dielectric matrix having passages with conductive members filled therein can be fabricated by various methods. In accordance with one aspect, such dielectric matrix can be fabricated as follows, First, a plurality of metal thin wires (for example, copper wires) and a liquid precursor material for forming the dielectric matrix (for example, liquid silicone resin, liquid epoxy resin) are provided. The metal thin wires are arranged in parallel, and the liquid precursor material is poured in between, and is cured. The dielectric matrix thus obtained containing a plurality of metal thin wires is cut into slices orthogonal to the metal thin wires to obtain the dielectric matrix with metal thin wires extending from the first surface to the second surface.

In accordance with another aspect, the dielectric matrix having passages with conductive members filled therein can be fabricated as follows.

First, a film is formed from the material of the dielectric matrix material. Suitable processing such as laser processing is performed on this film to form a plurality of fine through-holes. Then, electrically conductive members are filled in these through-holes using suitable means such as plating method or the like to obtain the dielectric matrix with metal members extending from the first surface to the second surface.

The dielectric matrix having passages with conductive members filled therein may be of ordinary size, for example, a film of 0.2 to 2 mm in thickness.

Figure 3:
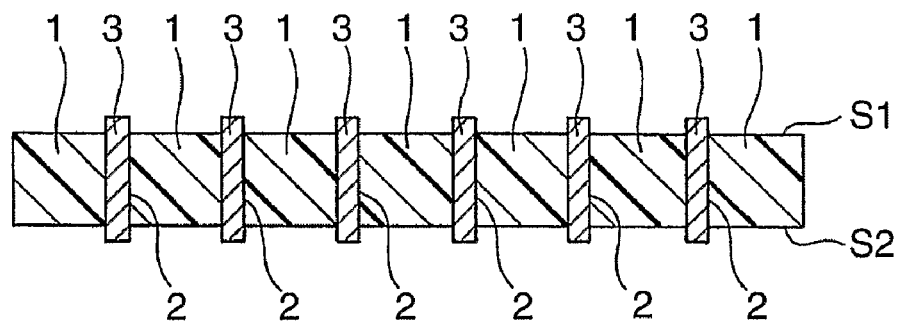
FIG. 3 is a sectional view showing a structure according to another embodiment having electrically conductive members in a plurality of passages extending from a first surface to a second surface of a dielectric matrix.

End portions of the electrically conductive members may be at the same level as the first surface and the second surface of the dielectric matrix, or they may project from these surfaces. FIG. 3 is a sectional view showing a structure comprising the dielectric matrix having a plurality of passages with electrically conductive members extending from the first surface to the second surface in accordance with another aspect. As shown in the figure, end portions of the electrically conductive members 3 project from the first surface S1 and/or the second surface S2 of the dielectric matrix 1, so that good contact with connecting parts of other circuit board or electronic component circuit can be obtained, and problem of contact failure is unlikely. Such a structure can be obtained, for example, by performing laser processing on region other than the electrically conductive members so as to remove the surface of the dielectric matrix 1. It is sufficient that the difference in height of the end portions of the electrically conductive members 3 and the surface of the dielectric matrix 1 is, for example, about 5 to 50 μm.

In the anisotropic electrically conductive structure of the present invention, a heat curable adhesive layer is disposed on at least one or both of the first surface and the second surface of the dielectric matrix. The adhesive used for the heat curable adhesive layer is a heat fluidizing and heat curable adhesive that exhibits thermal fluidizability when heated to a certain temperature, and is hardened when further heated to a higher temperature. In general, it is preferable to use an adhesive composition containing resin component having fluidizing temperature of 60 to 120° C. and curing temperature of 120 to 180° C.

A "fluidizing temperature" is the temperature at which viscosity of a polymer resin is 10,000 Pa·s or less, and can be measured using a parallel plate type viscosity meter (plastometer) or a viscoelasticity meter. A "curing temperature" is the temperature at which curing reaction of a heat curable resin proceeds 50% or more in 60 minutes, and can be measured using a viscoelasticity meter or a differential scanning calorimeter (DSC).

A resin contained in a heat curable adhesive composition, which exhibits both heat fluidizing and heat curable properties, is a resin that contains both thermoplastic component and heat curable component. In a first aspect, a heat fluidizing and heat curable resin can be a mixture of thermoplastic resin such as phenoxy resin and heat curable resin such as epoxy resin. In a second aspect, a heat fluidizing and heat curable resin may be a heat curable resin modified with a thermoplastic component. Examples of the second aspect include a polycaprolactone-modified epoxy resin. In a third aspect, a heat fluidizing and heat curable resin may be a copolymer resin having basic structure of thermoplastic resin with a heat curable group such as epoxy group. Examples of such copolymer resin include, for example, a copolymer of ethylene and glycidyl-(meth)acrylate.

An adhesive composition that is particularly suitable to be used for the heat curable adhesive layer, is a heat curable adhesive composition containing a caprolactone-modified epoxy resin. The heat curable adhesive composition containing a caprolactone-modified epoxy resin will be described below.

Such a heat curable adhesive composition has typically a crystalline phase. In at least one aspect, this crystalline phase contains the caprolactone-modified epoxy resin as a main component. The modified epoxy resin can give suitable flexibility to the heat curable adhesive composition and can improve the viscoelastic property of the heat curable adhesive. As a result, the heat curable adhesive exhibits cohesion even before curing, and develops adhesive strength upon heating. Like ordinary epoxy resin, the modified epoxy resin also forms hardened product having three dimensional network structure upon heating, and can give cohesion to the heat curable adhesive.

In view of improvement of initial adhesive strength, such a modified epoxy resin has an epoxy equivalent of typically about 100 to about 9,000, preferably about 200 to about 5,000, more preferably about 500 to about 3,000. Examples of suitable modified epoxy resins having such epoxy equivalent are commercially available under the trade name PLAXEL G-series from Daicel Chemical Industries Co.

The heat curable adhesive composition may further contain thermoplastic resins in addition to the caprolactone-modified epoxy resin. Particularly preferred thermoplastic resin is a phenoxy resin. A phenoxy resin is a thermoplastic resin of relatively high molecular weight having chain or linear structure, and is formed from epichlorohydrin and bisphenol A. Such phenoxy resin is easy to be processed, and can be advantageously used to form the heat curable adhesive layer as a film. This phenoxy resin is contained in the heat curable adhesive composition in an amount of typically 10 to 60 parts by weight, preferably 20 to 50 parts by weight, and more preferably 25 to 40 parts by weight, relative to 100 parts by weight of the caprolactone-modified epoxy resin. In this way, phenoxy resin can be effectively co-solved with above-described modified epoxy resin. Thus, bleeding of the modified epoxy resin from the heat curable adhesive composition can be effectively prevented. Further, the phenoxy resin is entangled with hardened product of above-described modified epoxy resin, leading to further improvement of ultimate adhesive strength and thermal resistance, etc., of the heat curable adhesive layer.

Preferably, the heat curable adhesive composition contains, in combination with above-described modified epoxy resin, a melamine/isocyanuric acid adduct (hereinafter referred to as "melamine/isocyanuric acid complex"). Useful melamine/isocyanuric acid complex is commercially available under the trade name of MC-600 from Nissan Chemical Industries Co. It is effective for toughening of the heat curable adhesive composition, reduction of tackiness of the heat curable adhesive composition before heat curing due to development of thixotropy, and suppression of hygroscopicity and fluidity of the heat curable adhesive composition. The heat curable adhesive composition can contain, in order to prevent embrittlement of the hardened product without impairing above-mentioned effects, this melamine/isocyanuric acid complex in an amount of typically 1 to 200 parts by weight, preferably 2 to 100 parts by weight, and more preferably 3 to 50 parts by weight, relative to 100 parts by weight of the modified epoxy resin.

As desired, the heat curable adhesive composition may further contain a second epoxy resin in combination or independently of the above-described phenoxy resin. This epoxy resin is not particularly restricted as long as it does not depart from the scope of the present invention. Thus, bisphenol A epoxy resin, bisphenol F epoxy resin, bisphenol A diglycidyl ether type epoxy resin, phenol novolac type epoxy resin, cresol novolac type epoxy resin, fluorene epoxy resin, glycidyl amine epoxy resin, aliphatic epoxy resin, brominated epoxy resin, fluorinated epoxy resin, or the like may be used. Like modified epoxy resin, these epoxy resin is easy to be compatible with phenoxy resins and give rise to little bleeding from the heat curable adhesive composition. In particular, when the heat curable adhesive composition contains a second epoxy resin preferably in an amount of 50 to 200 parts by weight, and more preferably in an amount of 60 to 140 parts by weight relative to 100 parts by weight of modified epoxy resin, it is advantageous for improving thermal resistance.

In carrying out the present invention, bisphenol A diglycidyl ether type epoxy resin can be used as a preferred epoxy resin. The diglycidyl ether type epoxy resin is in liquid state, and can improve, for example, high temperature characteristics of the heat curable adhesive composition. For example, by using the diglycidyl ether type epoxy resin, chemical resistance and glass transition temperature can be improved by curing at high temperature. Applicable range of curing agent can also be broadened, and curing conditions are relatively less strict. Such a diglycidyl ether type epoxy resin is commercially available under the trade name of D. E. R. 332 from Dow Chemical (Japan) Co.

A curing agent can be added as required to the heat curable adhesive composition to facilitate curing reaction of the above described epoxy resin and a second epoxy resin as the heat curable resins. Amount and type of this curing agent are not particularly limited as long as the desired effect can be obtained. But, in view of improvement of thermal resistance, a curing agent is contained in an amount of typically 1 to 50 parts by weight, preferably 2 to 40 parts by weight, and more preferably 5 to 30 parts by weight, relative to 100 parts by weight of above-described epoxy resin and required second epoxy resin. Examples of useful curing agents include, but not limited to, amine curing agents, acid anhydride, dicyandiamide, cationic polymerization catalyst, imidazole compounds, hydrazine compounds, etc, In particular, dicyandiamide can be mentioned as most promising curing agent in view of thermal stability at room temperature. With respect to diglycidyl ether type epoxy resin, aliphatic polyamine, polyamide, amideamine, etc. are desirably used.

Relative to 100 parts by weight of above-described adhesive composition, 15 to 100 parts by weight of organic particles may be added to the heat curable adhesive composition. With addition of organic particles, the resin exhibits plastic fluidity. On the other hand, the organic particles suppress excessive fluidity of the heat curable adhesive composition, and can prevent the adhesive from flowing out at the time of hot press bonding in the connection process.

The heat curable adhesive layer can be formed by drying the heat curable adhesive solution applied onto a release liner such as polyester subjected to release processing with silicone or the like. Such a heat curable adhesive layer is released from the liner and disposed on the first surface and the second surface of the dielectric matrix. Hot press bonding is performed at heat fluidizing temperature (for example, 60 to 120° C.) of the heat curable adhesive composition. When the dielectric matrix is a material of low surface adhesion such as silicone rubber, fluorosilicone elastomer, fluoroelastomer, or the like, the surface of the dielectric matrix may be subjected to surface treatment for improving the surface adhesion. For example, a primer containing a silane coupling agent or a silicone containing epoxy compound may be applied to the surface of the dielectric matrix.

The heat curable adhesive layer is generally, but is not limited to, 10 to 200 μm in thickness. If the adhesive layer is too thin, sufficient connection of the objects to be connected cannot be obtained, and may lead to low reliability of connection. If the adhesive layer is too thick, the adhesive layer may flow out at the time of hot press bonding.

Figure 4:
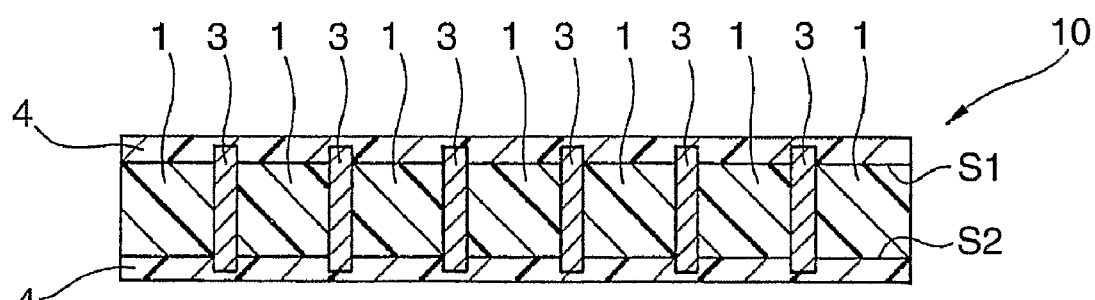
FIG. 4 is a sectional view showing an anisotropic electrically conductive structure according to an embodiment of the present invention.

The anisotropic electrically conductive structure of the present invention can be obtained by the method as described above. FIG. 4 is a sectional view showing an anisotropic electrically conductive structure according to one embodiment of the present invention. In the figure, the anisotropic electrically conductive structure 10 has a heat curable adhesive layer 4 on each of the first surface S1 and the second surface S2 of the dielectric matrix 1. The heat curable adhesive layer 4 may be formed on only one of the two surfaces S1 and S2. Although end portions of the electrically conductive members 3 project from the first surface S1 and the second surface S2 in the figure, they may not necessarily project from these surfaces. But, preferably, end portions of the electrically conductive members 3 project from the first surface S1 and the second surface S2 so as to be able to ensure good contact at the connecting parts with such projections. On the other hand, the end portions of the electrically conductive members 3 are embedded within the heat curable adhesive layer 4. With this construction, the heat curable adhesive layer 4. serves as a protecting film for the electrically conductive members 3. When the anisotropic electrically conductive structure 10 is used as a connector, the heat curable adhesive layer 4 is displaced at the time of hot press bonding due to thermal fluidization by heating, so that the end portions of the electrically conductive members 3 reliably come in contact with the connecting parts of objects to be connected. Since the adhesive is present in ample amount, the connecting parts can be securely fastened and reliability of the connection process is ensured.

The anisotropic electrically conductive structure of the present invention can be used as a suitable connector for connecting electronic components having a plurality of connecting parts with each other. For example, electronic components such as semiconductor devices or circuit boards can be brought into contact via the anisotropic electrically conductive structure of the present invention with each other, and then hot press bonding can be performed by heating to heat curing temperature (for example, 120° C. or higher) of the heat curable adhesive layer to achieve connection of the two electronic components.

The invention claimed is:

1. An anisotropic electrically conductive structure comprising:
   a dielectric matrix having a first surface and a second surface;
   a heat curable adhesive layer disposed on at least one or both of said first surface and said second surface, wherein said heat curable adhesive layer comprises a caprolactone-modified epoxy resin, and wherein the heat curable adhesive layer further comprises a thermoplastic phenoxy resin;
   a plurality of passages at least extending from said first surface of said dielectric matrix to said second surface of said dielectric matrix; and
   electrically conductive members in said passages, wherein the electrically conductive members assure a plurality of electrically conductive paths extending from said first surface to said second surface;
   wherein said dielectric matrix does not exhibit thermal fluidization at a temperature required for heat curing of said heat curable adhesive layer.

2. An anisotropic electrically conductive structure according to claim 1, wherein end portions of said electrically conductive members project from said first surface and/or second surface.

3. An anisotropic electrically conductive structure according to claim 2, wherein said end portions of said electrically conductive members project with the difference between the height of said end portions and the height of said first surface and/or second surface of being 5 to 50 μm.

4. An anisotropic electrically conductive structure according to claim 2, wherein said end portions of said electrically conductive members are embedded within said heat curable adhesive layer.

5. An anisotropic electrically conductive structure according to claim 1, wherein said dielectric matrix is selected from the group consisting of silicone rubber, fluorosilicone, fluoroelastomer, polyimide resin, and hardened product of heat curable resins.

6. An anisotropic electrically conductive structure according to claim 1, wherein said electrically conductive member is a metal or an alloy selected from the group consisting of copper, gold, silver, nickel, tungsten, tin, lead, palladium, bismuth, indium and alloys of these metals.

* * * * *